United States Patent
Millard et al.

(10) Patent No.: US 7,362,584 B2
(45) Date of Patent: Apr. 22, 2008

(54) HEAT RELIEF SOCKET

(75) Inventors: Steven J Millard, Mechanicsburg, PA (US); John F D'Ambrosia, Harrisburg, PA (US)

(73) Assignee: Tyco Electronics Corporation, Middletown, PA (US)

(*) Notice: Subject to any disclaimer, the term of this patent is extended or adjusted under 35 U.S.C. 154(b) by 55 days.

(21) Appl. No.: 11/400,561

(22) Filed: Apr. 7, 2006

(65) Prior Publication Data

US 2007/0236892 A1  Oct. 11, 2007

(51) Int. Cl.
*H05K 7/20* (2006.01)
(52) U.S. Cl. ............ 361/720; 361/695; 361/719; 174/15.1; 174/16.1; 165/80.2; 165/80.3; 165/104.33; 165/104.34; 439/190; 439/485
(58) Field of Classification Search ........ 361/688–691, 361/692–697, 704–712, 717–721; 257/712–713, 257/717–727; 174/15.1, 16.1, 16.3, 252; 165/80.2, 80.3, 185, 104.33; 324/754–758, 324/765; 439/196–198, 342, 485–487, 190–192, 439/374, 892, 149, 70, 73, 381

See application file for complete search history.

(56) References Cited

U.S. PATENT DOCUMENTS

| 5,528,466 | A | 6/1996 | Lim et al. |
| 5,559,673 | A | 9/1996 | Gagnon et al. |
| 6,067,228 | A * | 5/2000 | Li ................. 361/695 |
| 6,184,454 | B1 * | 2/2001 | Imai et al. ........... 84/622 |
| 6,654,247 | B1 | 11/2003 | Lee ................ 361/697 |
| 6,717,422 | B2 * | 4/2004 | Akram ............ 324/754 |
| 6,840,794 | B2 * | 1/2005 | Chiu ............... 439/485 |
| 6,932,635 | B2 * | 8/2005 | Ishikawa et al. ...... 439/190 |
| 6,945,788 | B2 | 9/2005 | Trout et al. |

FOREIGN PATENT DOCUMENTS

JP  407169884 A  *  7/1995

* cited by examiner

*Primary Examiner*—Michael Datskovskiy

(57) ABSTRACT

A heat relief socket is provided where a contact carrier substrate is provided carrying a plurality of contacts, and is supported by a frame. The frame has an open area therethrough which can receive air flow to cool the bottom of a chip carried by the socket and the contacts themselves.

7 Claims, 6 Drawing Sheets

HEAT RELIEF SOCKET

FIELD OF THE INVENTION

The subject invention relates to a socket for mounting to a printed circuit board, whereby heat can be released from the socket.

BACKGROUND OF THE INVENTION

It is common in electronic systems to provide a socket mounted directly to a printed circuit board, which can receive some type of an integrated circuit, normally in the form of a chip. In the operation of such circuit devices, particularly large integrated circuit chips, significant heat is generated by the chips, and when in use, can overheat, malfunction, or in some cases cause the chip to fail.

Some attempts have been made to cool the chips. It is known to provide cooling to the chip by way of heat sinks. These are typically in the form of thermally conductive material placed adjacent to the chip, and can include fins to promote faster cooling due to the increased surface area for conduction of heat away from the chip. It is also known to place a fan above a heat sink to cool the chip, by a combination of conduction and convection. It is even know to provide water cooled heat sinks in the case of larger chips.

The objects of the invention are to improve upon these existing systems.

SUMMARY OF THE INVENTION

The objects have been accomplished by providing a socket, comprising a contact carrier substrate, and a plurality of contacts mounted to the contact carrier substrate. An open area is formed adjacent at least one edge of the contact carrier substrate; and a mechanism is provided for air flow through the open area and across the contact carrier substrate.

The mechanism for providing air flow may be a fan. The socket may further comprise a duct provided adjacent to the open area for connecting the air flow to the open area. A frame may also position the contact carrier substrate above a printed circuit board, with the open area extending through the frame. The duct may alternatively be connected to the frame, or be integrated with the frame.

An alternate embodiment printed circuit board assembly comprises a printed circuit board and a socket mounted to the printed circuit board having a contact carrier substrate, a plurality of contacts mounted to the contact carrier substrate, and an open area formed adjacent at least one edge of the contact carrier substrate. A mechanism for providing air flow through the open area and across the contact carrier substrate is included. The assembly also includes an integrated circuit connected to the socket.

The mechanism for providing air flow may be a fan. The socket may further comprise a duct adjacent to the open area for connecting the air flow to the open area. The duct and the fan may be mounted to the printed circuit board. Alternatively, the duct and the fan may be mounted above the integrated circuit. A frame may also position the contact carrier substrate above a printed circuit board, with the open area extending through the frame. The duct may alternatively be connected to the frame, or be integrated with the frame.

DETAILED DESCRIPTION OF THE EMBODIMENTS

Figure 1:
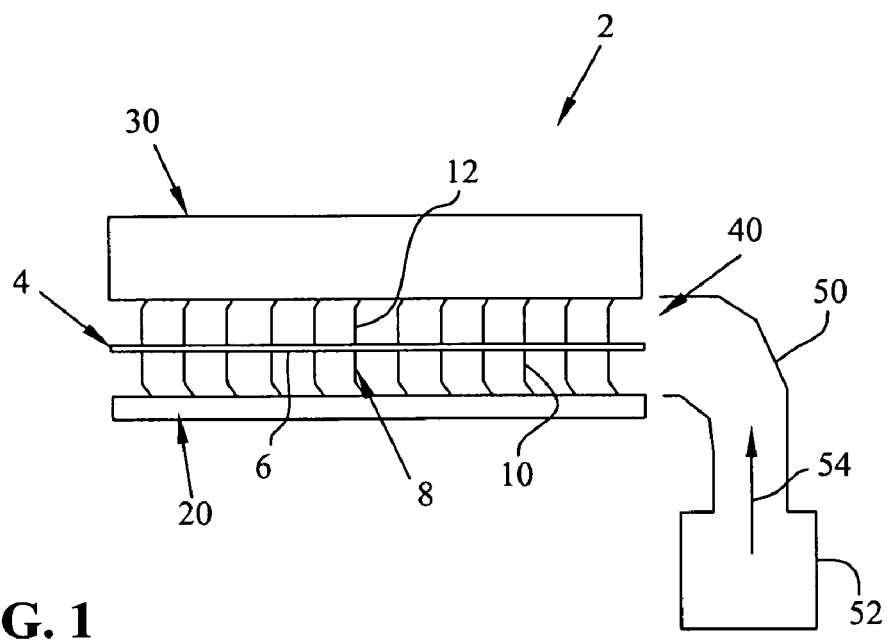
FIGS. 1 and 2 show diagrammatical views of the present invention.

With reference first to FIG. 1, the invention is shown diagrammatically as a socket assembly to be comprised generally of an interposer type socket 4 having a contact carrier substrate 6 carrying a plurality of contacts 8. Contacts 8 are comprised of printed circuit board contacts 10 and upper chip contacts 12. The interposer type socket 4 could be of the type shown by any of the embodiments in U.S. Pat. No. 6,945,788, incorporated herein by reference.

As shown, socket 4 is attached to printed circuit board 20 and interconnects a chip 30 to printed circuit board 20. A generally open area 40 is shown either above or below the contact carrying substrate (or both) which can be used for cooling the contacts and/or the chip by way of induced air flow.

In this regard, a duct 50 is provided directed towards open area 40 and includes a fan 52 which provides air flow in the direction of arrow 54 into the open area 40 for cooling chip 30 and/or contacts 8.

Figure 2:
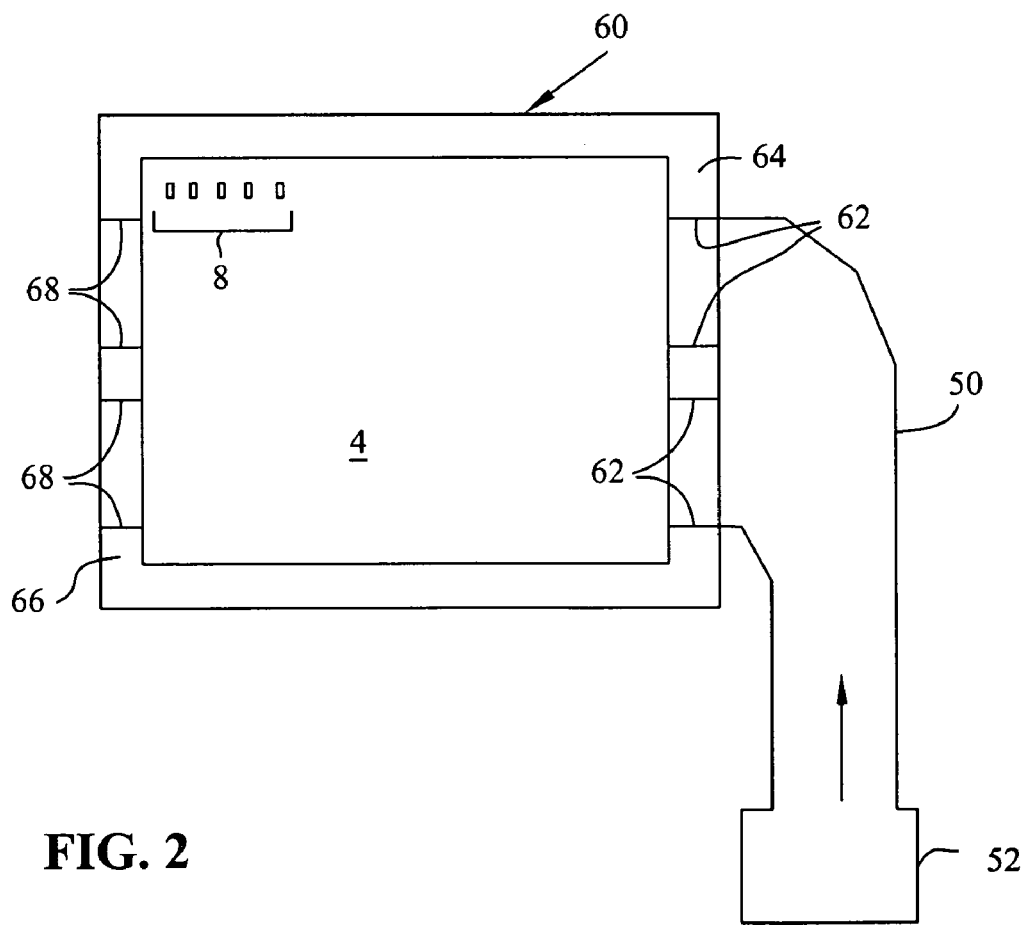

With respect now to FIG. 2, the socket 4 can also be provided with a frame 60 whereby openings 62 are provided through at least one of the walls 64, whereby input openings 62 define the generally open area to which duct 50 can be connected. On another of the walls, and in this case wall 66, exit openings 68 are formed for exhausting the warm air which has been forced through by fan 52.

Figure 3:
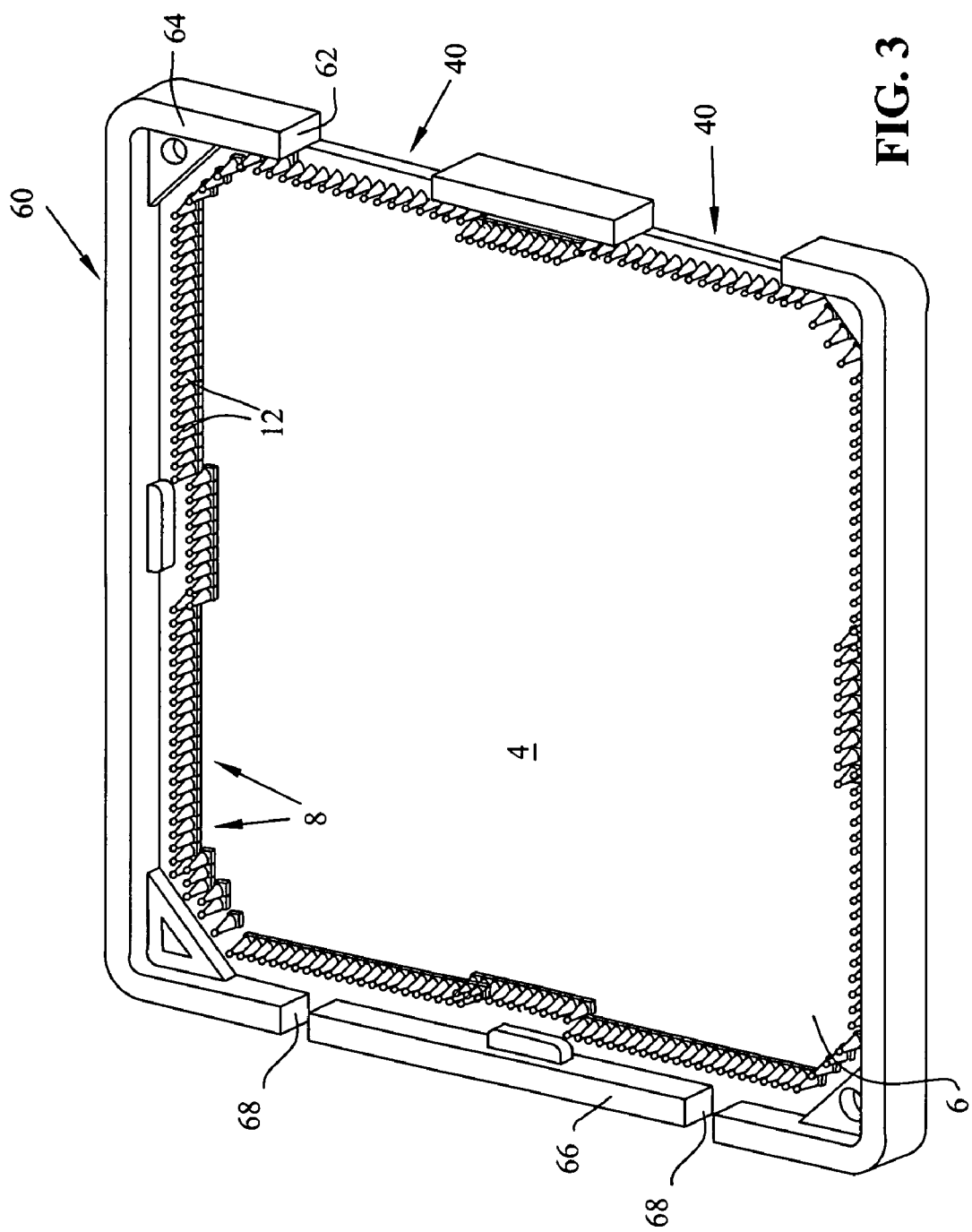
FIG. 3 shows an upper perspective view of the frame and carrier substrate of the present invention.

With respect now to FIG. 3, the embodiment of FIGS. 1 and 2 is shown with more particularity. As shown in FIG. 3, frame 60 is shown with contact carrying substrate 4 positioned therein providing upper contact portions 12 positioned above substrate 6. Openings 62 through wall 64 provide for a generally open area 40 across substrate 6 for cooling purposes. Exit openings 68 provide an exit for the heated air through wall 66.

Figure 4:
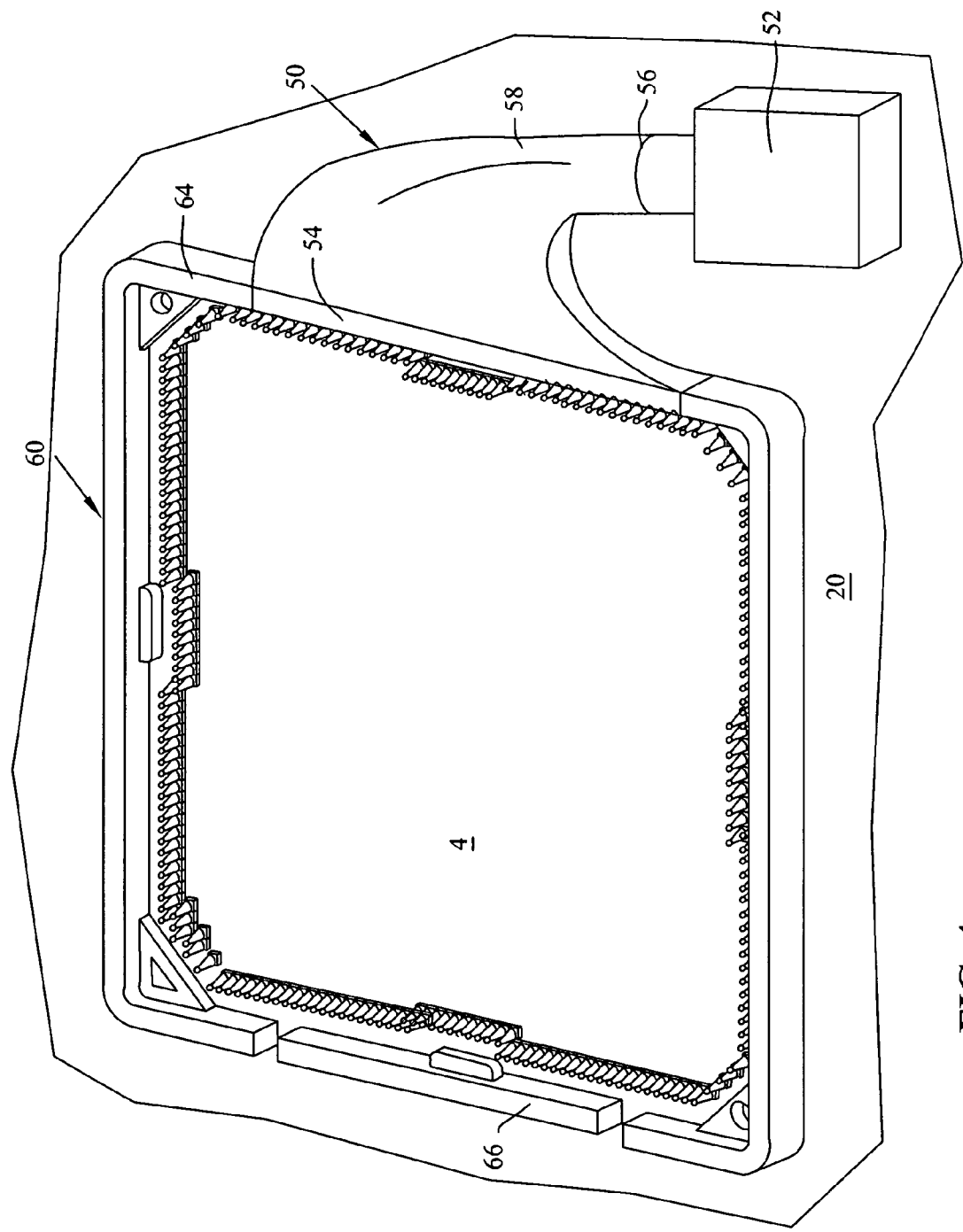
FIG. 4 shows a view similar to that of FIG. 3 showing the inclusion of an air cooling duct.
Figure 5:
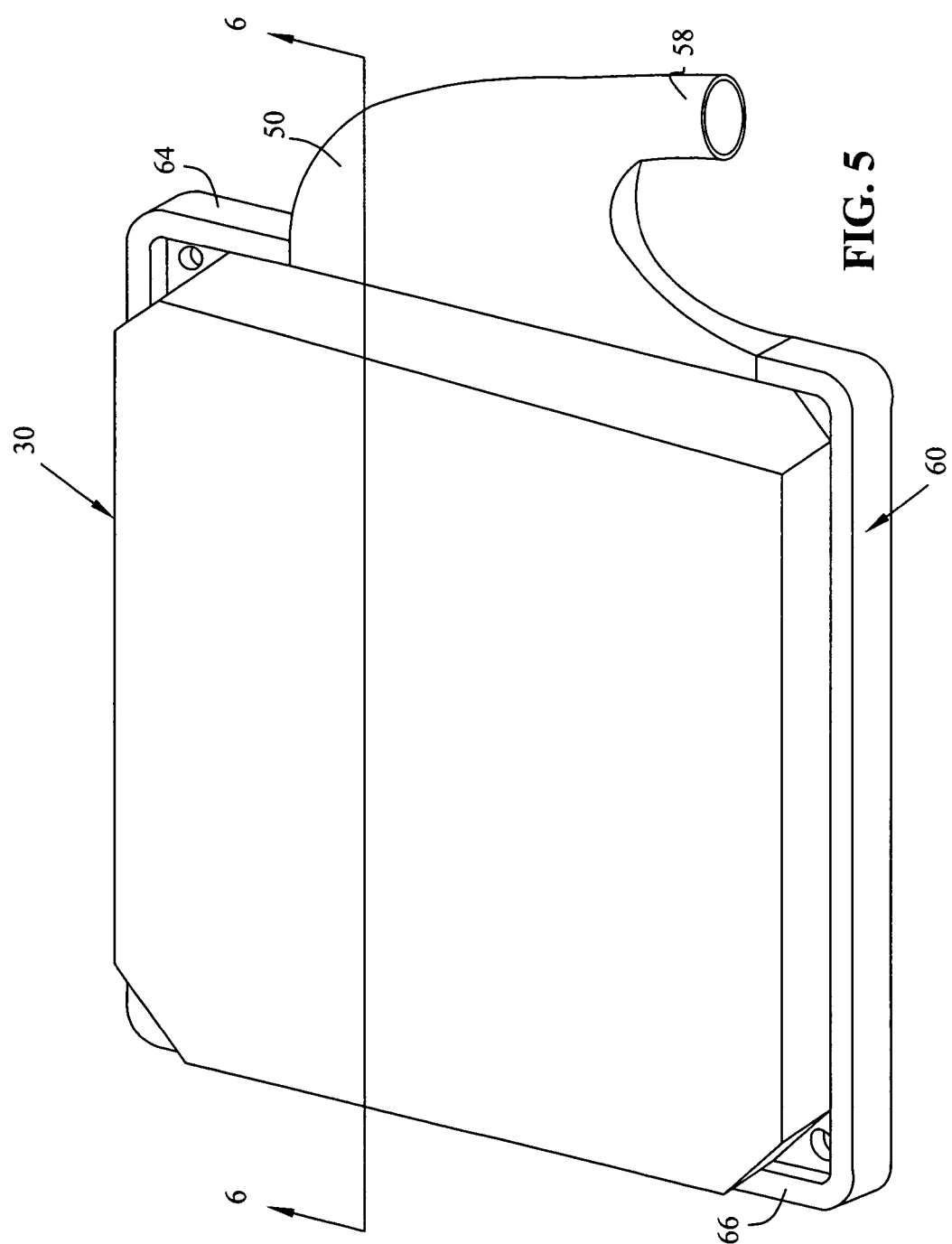
FIG. 5 is a view similar to that of FIG. 4 showing an integrated circuit chip in place.

With reference now to FIG. 4, duct 50 is shown positioned against wall 64 and can be positioned in any manner desirable. Duct 50 could be similar to that shown with a flange 54 abutted against wall 64 and attached in place by way of fasteners, ultrasonic welding, adhesives, and the like. Fan 52 is shown mounted to printed circuit board 20 with an exit port 56 extending into duct opening 58. FIG. 5 is similar to FIG. 4 showing the chip 30 in place within the frame 60.

Figure 6:
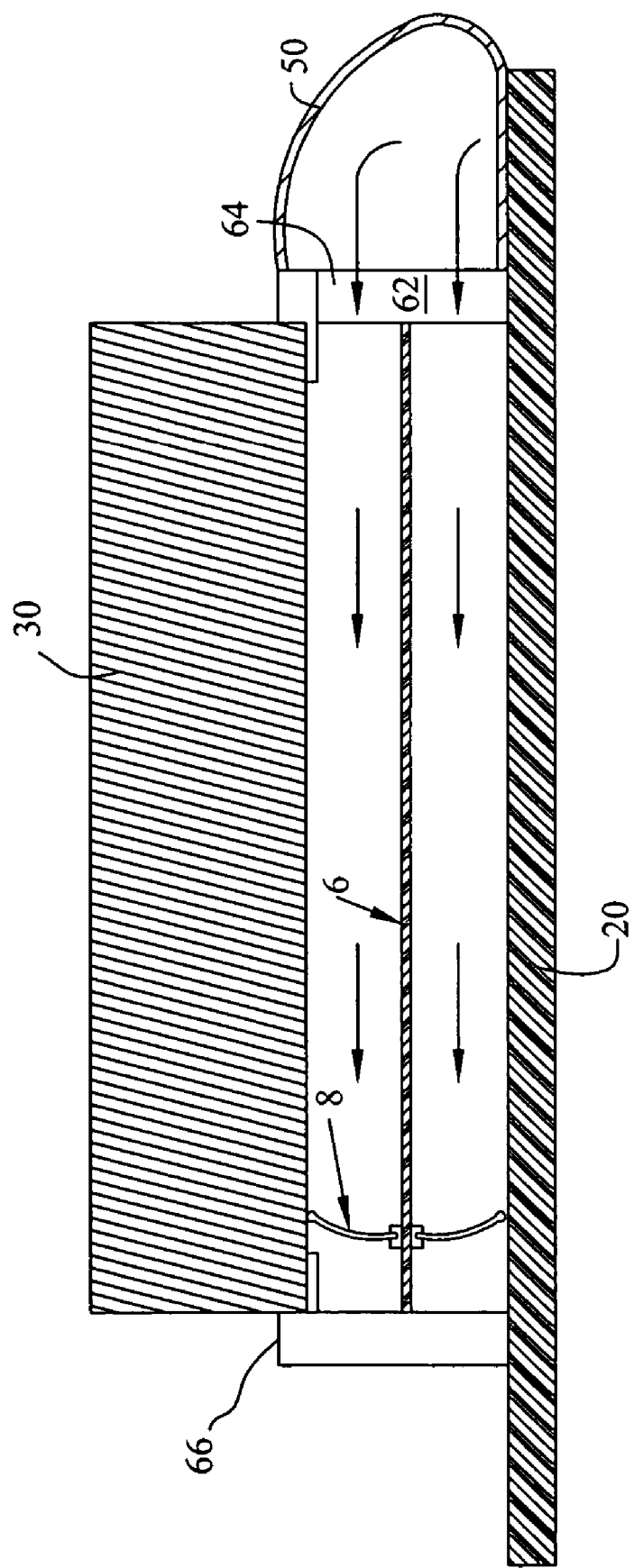
FIG. 6 shows a cross-sectional view through lines 6-6 of FIG. 5.

With reference now to FIG. 6, duct 50 is shown in cross-sectional view (taken through lines 6-6 of FIG. 5) and shows duct 50 attached to sidewall 64. As attached, air through duct 50 can flow through input openings 62 and across substrate 6. As shown, the air can contact the bottom of the chip 30 as well as across the plurality of contacts 8.

Figure 7:
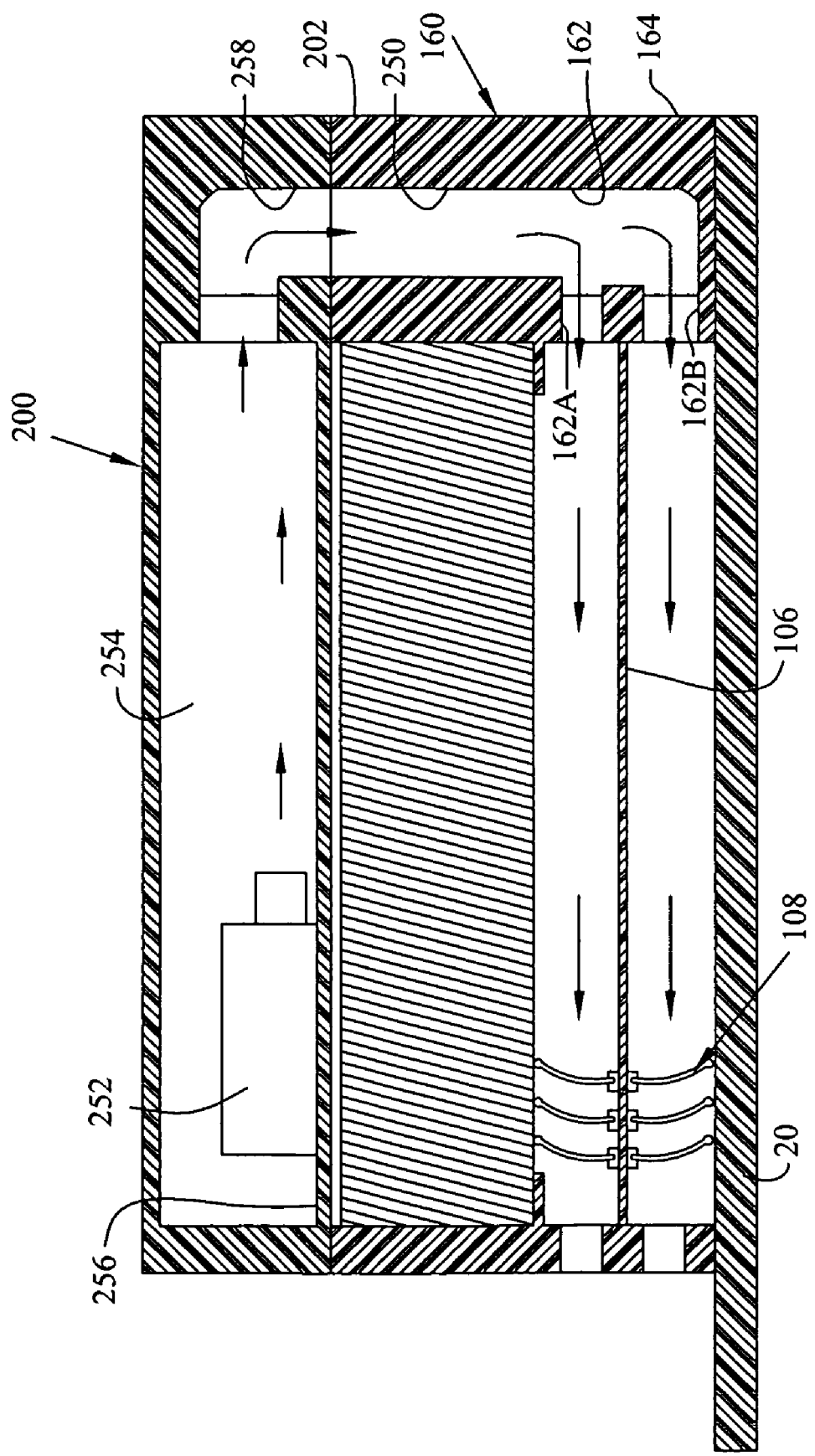
FIG. 7 shows a cross-sectional view of an alternate embodiment socket assembly.

With reference now to FIG. 7, an alternate embodiment is shown where frame 160 carries substrate 106 and contacts 108. Frame 160 could include sidewall 164 where opening 162 is formed integrally with wall 164 having integrated openings 162a and 162b. Openings 162a and 162b may direct air flow above and below substrate 106, respectively. A cover portion 200 could be received over frame 160 and include a sidewall 202 positioned on top of the frame wall 164.

The fan 252 could sit within a pocket 254 of the cover 200, and reside on a floor 256. In this embodiment, sidewall 202 would include an opening 258, and duct 250 would be formed by the combination of openings 162 and 258. In this embodiment, the fan would operate exhausting air into opening 254 through the duct 250 and through openings 162a and 162b. The warm air would be exhausted through exit openings 168.

It should be appreciated that various changes may be made to the embodiments without departing from the spirit of the invention. For example, the ratios of the cross sectional area for the input openings and exit openings can be varied for the air flow rates, and the like. Furthermore, the exact locations for input and exit openings may be changed in number and/or location. For example, the input openings could be adjacent to the corners of the sidewall and the exit opening(s) in the center of the opposite wall, or vice versa. Furthermore, the input or exit ports could be on all four walls to cause greater turbulent air flow though the socket.

What is claimed is:

1. A socket assembly, comprising:
   a frame;
   a contact carrier substrate mounted in the frame;
   a plurality of contacts mounted to the contact carrier substrate;
   an open area formed adjacent at least one edge of the contact carrier substrate;
   a duct adjacent to the open area; and
   a fan for providing air flow through the duct and through the open area and across the contact carrier substrate;
   wherein the fan is mounted in the frame above the contact carrier substrate.

2. The socket of claim 1, wherein the duct is connected to the frame.

3. The socket of claim 1, wherein the duct is integrated with the frame.

4. A printed circuit board assembly, comprising:
   a printed circuit board;
   socket mounted to the printed circuit board having a contact carrier substrate, a plurality of contacts mounted to the contact carrier substrate, and an open area formed adjacent at least one edge of the contact carrier substrate;
   a duct adjacent to the open area; and
   a fan for providing air flow through the duct and through the open area and across the contact carrier substrate; and
   wherein the duct and the fan are mounted to the printed circuit board.

5. The printed circuit board assembly of claim 4, further comprising a frame positioning the contact carrier substrate above the printed circuit board, the open area extending through the frame.

6. The printed circuit board assembly of claim 4, wherein the duct is connected to the frame.

7. The printed circuit board assembly of claim 4, wherein the duct is integrated with the frame.

* * * * *